(12) United States Patent
Wade et al.

(10) Patent No.: US 6,315,381 B1
(45) Date of Patent: Nov. 13, 2001

(54) ENERGY CONTROL METHOD FOR AN INKJET PRINT CARTRIDGE

(75) Inventors: John Wade; Graham Ross, both of Poway, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/071,138

(22) Filed: Apr. 30, 1998

Related U.S. Application Data

(63) Continuation-in-part of application No. 08/958,951, filed on Oct. 28, 1997.

(51) Int. Cl.$^7$ .................................................. B41J 29/393
(52) U.S. Cl. ................................................................. 347/19
(58) Field of Search ................................... 347/19, 14, 9, 347/5, 56, 57, 10, 87, 180, 181, 182

(56) References Cited

U.S. PATENT DOCUMENTS

| | | | |
|---|---|---|---|
| 5,068,674 | 11/1991 | Sato et al. ........................ | 347/62 |
| 5,418,558 | * 5/1995 | Hock et al. ...................... | 347/14 |
| 5,428,376 | * 6/1995 | Wade et al. ...................... | 347/14 |
| 5,493,300 | * 2/1996 | Eiler et al. ....................... | 341/154 |
| 5,521,620 | 5/1996 | Becerra et al. ................... | 347/14 |
| 5,610,635 | * 3/1997 | Murray et al. ................... | 347/7 |
| 5,682,185 | 10/1997 | Wade ................................ | 347/19 |
| 5,699,091 | * 12/1997 | Bullock et al. ................... | 347/19 |
| 5,742,307 | 4/1998 | Hawkins et al. ................. | 347/62 |
| 5,812,156 | * 9/1998 | Bullock et al. ................... | 347/19 |
| 6,024,438 | * 2/2000 | Koike et al. ...................... | 347/43 |
| 6,068,363 | * 5/2000 | Saito ................................. | 347/17 |
| 6,116,717 | * 9/2000 | Anderson et al. ................ | 347/19 |

FOREIGN PATENT DOCUMENTS

| | | | |
|---|---|---|---|
| 0 709213A | 5/1996 | (EP) ............................. | B41J/2/195 |
| 04073151 | 3/1992 | (JP) . | |
| 06000957 | 6/1992 | (JP) ............................. | B41J/2/045 |
| 07242004 | 9/1995 | (JP) ............................. | B41J/2/30 |

* cited by examiner

Primary Examiner—John Barlow
Assistant Examiner—Blaise Mouttet
(74) Attorney, Agent, or Firm—Dennis G. Stenstrom

(57) ABSTRACT

The present invention is an energy control system and method for an inkjet printer cartridge for controlling the droplet firing energy. One embodiment of the present invention includes calibrating an inkjet print cartridge having a printhead die divided into sections. This method includes selecting an operational range of the inkjet print cartridge, measuring the electrical characteristics of the electrical components over this operational range, calculating an optimal calibration value for the electrical characteristics of each section, and storing these optimal calibration values. In addition, the present invention allows operation of an inkjet printer having a print cartridge for determining optimal operating settings for the print cartridge. This method includes reading calibration values stored on the print cartridge, performing tests using the calibration values to determine optimal operating settings, adjusting settings on the print cartridge to the optimal operating settings, and storing the optimal operating settings in the printer.

30 Claims, 10 Drawing Sheets

ENERGY CONTROL METHOD FOR AN INKJET PRINT CARTRIDGE

CROSS-REFERENCE TO RELATED APPLICATIONS

This application is a continuation-in-part of U.S. patent application Ser. No. 08/958,951, filed Oct. 28, 1997, entitled "Thermal Ink Jet Print Head and Printer Energy Control Apparatus and Method." This application is also related to U.S. Pat. No. 5,418,558, entitled "Determining the Operating Energy of a Thermal Ink Jet Printhead Using an Onboard Thermal Sense Resistor;" U.S. Pat. No. 5,428,376, entitled "Thermal Turn on Energy Test for an Inkjet Printer;" U.S. Pat. No. 5,682,185 entitled "Energy Management Scheme for an Ink Jet Printer;" U.S. patent application Ser. No. 08/962,031, filed Oct. 31, 1997, entitled "Ink Delivery System for High Speed Printing" and U.S. patent application Ser. No. 08/960,945, filed Oct. 31, 1997, entitled "Apparatus and Method for Generating High Frequency Ink Ejection and Ink Chamber Refill." The foregoing commonly assigned patents and patent applications are herein incorporated by reference.

FIELD OF THE INVENTION

This invention relates to thermal inkjet printers, and more particularly to the control of droplet firing energy to provide a uniform output.

BACKGROUND OF THE INVENTION

Thermal inkjet hardcopy devices such as printers, graphics plotters, facsimile machines and copiers have gained wide acceptance. These hardcopy devices are described by W. J. Lloyd and H. T. Taub in "Ink Jet Devices," Chapter 13 of *Output Hardcopy Devices* (Ed. R. C. Durbeck and S. Sherr, San Diego: Academic Press, 1988). The basics of this technology are further disclosed in various articles in several editions of the *Hewlett-Packard Journal* [Vol. 36, No. 5 (May 1985), Vol. 39, No. 4 (August 1988), Vol. 39, No. 5 (October 1988), Vol. 43, No. 4 (August 1992), Vol. 43, No. 6 (December 1992) and Vol. 45, No. 1 (February 1994)], incorporated herein by reference. Inkjet hardcopy devices produce high quality print, are compact and portable, and print quickly and quietly because only ink strikes the paper.

An inkjet printer forms a printed image by printing a pattern of individual dots at particular locations of an array defined for the printing medium. The locations are conveniently visualized as being small dots in a rectilinear array. The locations are sometimes "dot locations", "dot positions", or pixels". Thus, the printing operation can be viewed as the filling of a pattern of dot locations with dots of ink.

Inkjet hardcopy devices print dots by ejecting very small drops of ink onto the print medium and typically include a movable carriage that supports one or more printheads each having ink ejecting nozzles. The carriage traverses over the surface of the print medium, and the nozzles are controlled to eject drops of ink at appropriate times pursuant to command of a microcomputer or other controller, wherein the timing of the application of the ink drops is intended to correspond to the pattern of pixels of the image being printed.

The typical inkjet printhead (i.e., the silicon substrate, structures built on the substrate, and connections to the substrate) uses liquid ink (i.e., dissolved colorants or pigments dispersed in a solvent). It has an array of precisely formed orifices or nozzles attached to a printhead substrate that incorporates an array of ink ejection chambers which receive liquid ink from the ink reservoir. Each chamber is located opposite the nozzle so ink can collect between it and the nozzle and has a firing resistor located in the chamber. The ejection of ink droplets is typically under the control of a microprocessor, the signals of which are conveyed by electrical traces to the resistor elements. When electric printing pulses heat the inkjet firing chamber resistor, a small portion of the ink next to it vaporizes and ejects a drop of ink from the printhead. Properly arranged nozzles form a dot matrix pattern. Properly sequencing the operation of each nozzle causes characters or images to be printed upon the paper as the printhead moves past the paper.

In an inkjet printhead the ink is fed from an ink reservoir integral to the printhead or an "off-axis" ink reservoir which feeds ink to the printhead via tubes connecting the printhead and reservoir. Ink is then fed to the various vaporization chambers either through an elongated hole formed in the center of the bottom of the substrate, "center feed", or around the outer edges of the substrate, "edge feed."

The ink cartridge containing the nozzles is moved repeatedly across the width of the medium to be printed upon. At each of a designated number of increments of this movement across the medium, each of the resistors is caused either to eject ink or to refrain from ejecting ink according to the program output of the controlling microprocessor. Each completed movement across the medium can print a swath approximately as wide as the number of nozzles arranged in a column of the ink cartridge multiplied times the distance between nozzle centers. After each such completed movement or swath the medium is moved forward the width of the swath, and the ink cartridge begins the next swath. By proper selection and timing of the signals, the desired print is obtained on the medium.

The energy applied to a firing resistor affects performance, durability and efficiency. It is well known that the firing energy must be above a certain firing threshold to cause a vapor bubble to nucleate. Above this firing threshold is a transitional range where increasing the firing energy increases the volume of ink expelled. Above this transitional range, there is a higher optimal range where drop volumes do not increase with increasing firing energy. In this optimal range above the optimal firing threshold drop volumes are stable even with moderate firing energy variations. Since, variations in drop volume cause disuniformities in printed output, it is in this optimal range that printing ideally takes place. As energy levels increase in this optimal range, uniformity is not compromised, but energy is wasted and the printhead is prematurely aged due to excessive heating and ink residue build-up.

In existing printheads having a dedicated connection for each firing resistor, a one time calibration of each connection by either the printer or production circuitry external to the print cartridge also compensates for any parasitic resistance or impedance in the unique path leading to each resistor. Printheads may be characterized at production to set these operating parameters. The printer then uses these operating parameters.

However, in new highly multiplexed printheads having different sets of resistors, there may be variations due to other factors. Each set of resistors is powered by a single voltage line that receives power via an electrical contact pad between the printer electronics and the removable print cartridge. This line continues on a flex circuit to a tab bonding connection to the printhead die having the firing resistors and other electronics. The impedance of the print cartridge contacts, tab bonding connections and connections in between, and resistors can vary from print cartridge to print cartridge. Also, impedance of the print cartridge can vary over time, even when the voltage provided by the printer to each of the cartridge contacts is well controlled. Consequently, as the data printed changes, the current draw through the line and the voltage as measured at the print cartridge terminals may be undesirably varied. For instance, when many or all resistors are fired simultaneously, the print cartridge voltage may be depressed by parasitic effects, giving a lower firing energy than when only one or a few resistors are fired.

Accordingly, there is a need for a method of operating a thermal inkjet printer with a removable printhead having a plurality of ink firing resistors that overcomes the limitations of existing methods discussed above.

SUMMARY OF THE INVENTION

The present invention provides a method of calibrating a removable print cartridge during manufacture and a method of operating an inkjet printer with a removable printhead. The method includes calibrating the print cartridge during manufacture and calibrating the printer during operation of the printer. The method includes the steps of selecting the desired pulse width, minimum over-energy and maximum over-energy; measuring the turn-on voltage for the selected pulse width; calculating the operating voltage from the minimum over-energy; calculating the maximum voltage from the maximum over-energy; setting the operating voltage equal to the maximum voltage; varying the operating voltage to find the maximum operating voltage; setting the operating voltage equal to the maximum operating voltage found; and writing the operating voltage to the memory device. The method of operating an inkjet printer in order to determine the operating settings to apply to a print cartridge installed in the printer, includes the steps of reading calibration information from a memory chip on the print cartridge; setting the printer to use the calibration information; performing tests using the calibration information to determine the operating conditions for the printer; adjusting the operating conditions for the printer using the calibration information; and storing the operating conditions in the printer.

DETAILED DESCRIPTION OF A PREFERRED EMBODIMENT

Figure 1:
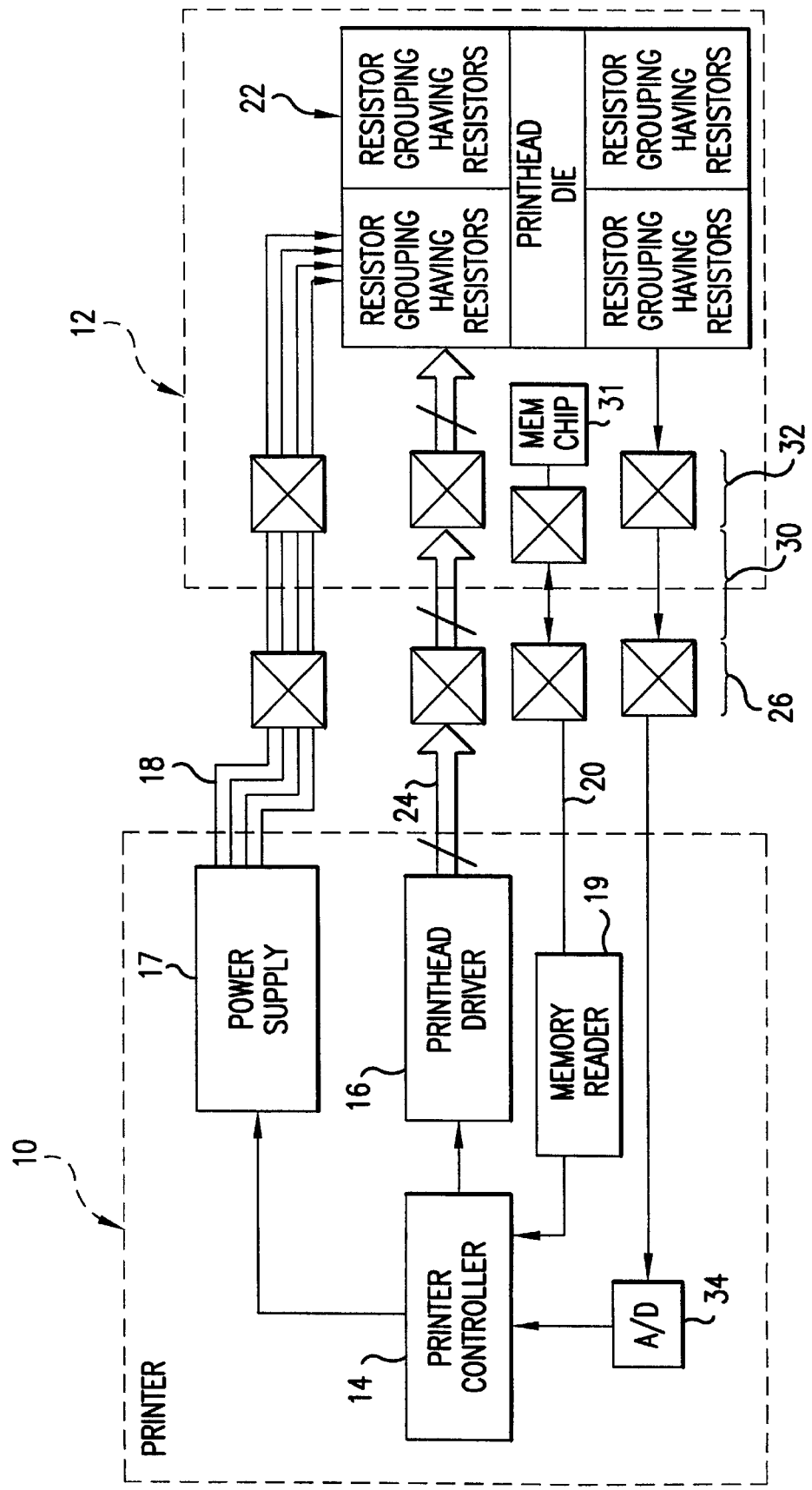
FIG. 1 is a schematic block diagram of a thermal inkjet printing apparatus according to a preferred embodiment of the invention.

FIG. 1 shows a schematic block diagram of an inkjet printer 10 with a connected print cartridge 12. A controller 14 in the printer receives print data from a computer or microprocessor (not shown) and processes the data to provide printer control information or image data to a printhead driver circuit 16. A controlled voltage power supply 17 provides a controlled voltage to a multiple line power bus 18. A memory reader circuit 19 in the printer 10 is connected to the controller 14 for transmitting information received from the print cartridge 12 via a memory line 20. The printhead driver circuit 16 is controlled by the controller 14 to send the image data to a printhead die 22 on the print cartridge 12, via a control bus 24 that has about twenty lines.

The cartridge is removably replaceable and is electrically connected to the printer by the control bus 24, power bus 18 and memory line 20. A connector interface 26 has a conductive pin for each line on the printer side contacting a corresponding pad on a flexible circuit 30 on the cartridge 12. A memory chip 31 on the cartridge stores printer control information programmed during manufacture of the cartridge and by the printer during use. The flex circuit 30 is connected to the printhead die 22 via tab bonds 32. An analog-to-digital converter 34 in the printer is connected to the printhead to receive data from the printhead that indicates the printhead's temperature.

The printhead 22 has a large number of nozzles with a firing resistor associated with each nozzle. The printhead may be arranged into any number of multiple similar subsections with each subsection having a particular number of primitives containing a particular number of resistors. As shown in FIG. 1, the printhead has 524 nozzles with 524 associated firing resistors and the printhead is arranged into four similar subsections or quadrants with each quadrant having eight "primitives" of 16 resistors each plus a primitive of three resistors. In order to provide a multiplexed printhead requiring only a limited number of lines between the printer and printhead, the current to the resistors flows through a voltage line and a ground line shared by other resistors in its quadrant. The resistors are individually addressable to provide unlimited pattern permutations, by a serial data stream fed from the printhead. While the invention is described herein in terms of four quadrants and specific primitives and resistor groupings, it will be apparent to one skilled in the art that the invention applies to any number of subsections and primitive/resistor arrangements. Additional details regarding inkjet printheads are described in U.S. patent application Ser. No. 08/962,031, filed Oct. 31, 1997, entitled "Ink Delivery System for High Speed Printing" which is herein incorporated by reference.

Figure 2:
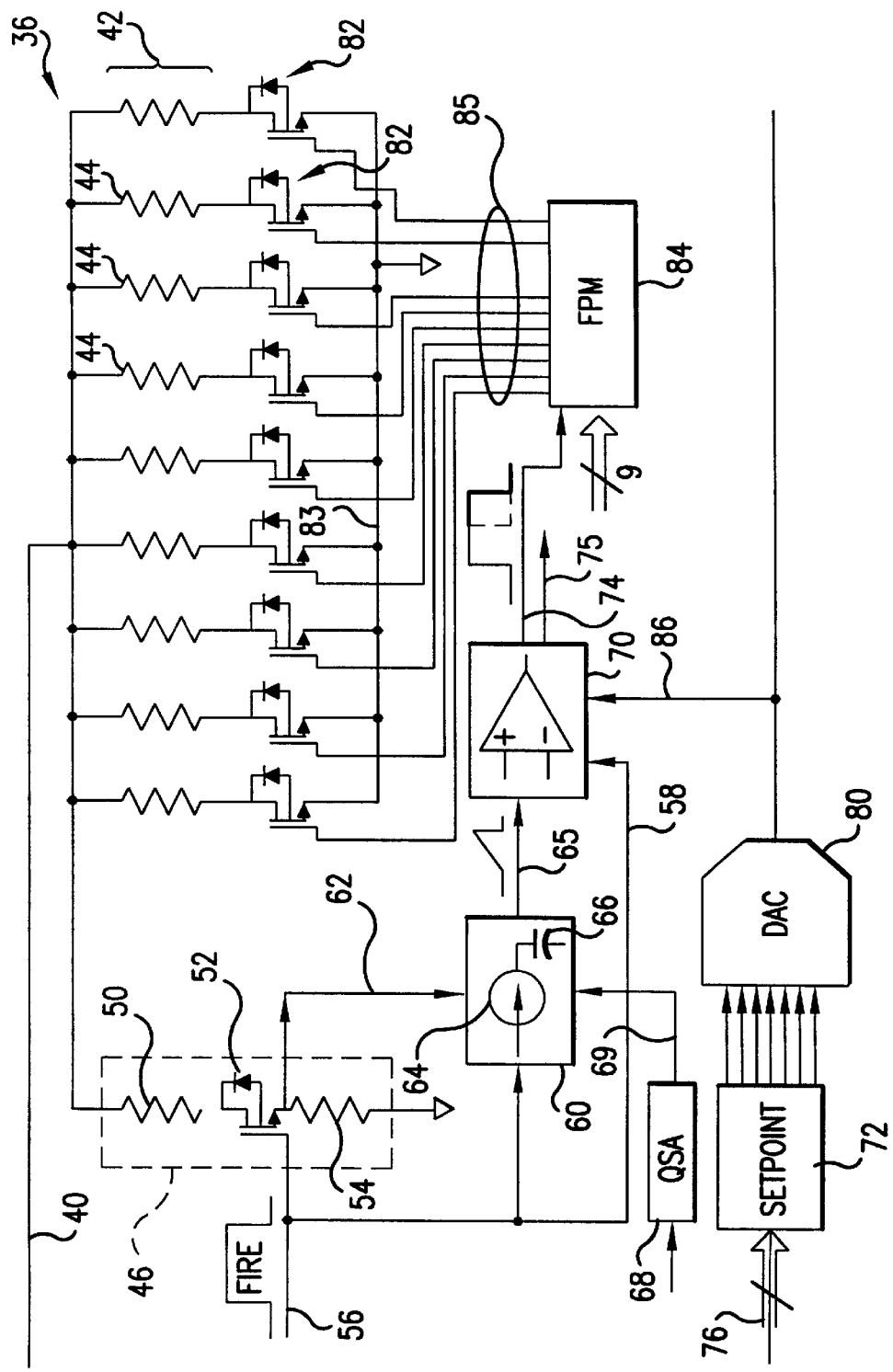
FIG. 2 is a detailed schematic of a printhead circuit of the embodiment of FIG. 1.

FIG. 2 shows a firing and energy control circuit 36 of a representative quadrant of the die, and showing an exemplary fraction of the many resistors of the quadrant (an nth one of the sixteen of the full primitive.) The circuit 36 resides on the printhead die and has a single pad to pad voltage input ("$V_{pp}$") 40 from the power bus 18 commonly connected to a set 42 of thin film firing resistors 44, each preferably 28 watts. A voltage sensing network 46 includes a high value resistor 50 having approximately ten times the resistance (280 watts) of the firing resistors 44, and connected to the input line 40 at the same node as the firing resistors. The sensing network further includes a LDMOS switch 52 having an input connected to the resistor 50, an output connected to a sense resistor 54 having a low value (10 watts) relative to the firing resistors, and a control line connected to a firing line 56 from the printer. The sense resistor is connected to ground.

A voltage-to-power converter circuit 60 has a primary input line 62 connected between the switch 52 and sense resistor 54. A firing input is connected to the firing line 56, so that a pulse on the firing line triggers the converter's operation. The converter includes a bias current generator 64 and an integration capacitor 66. A voltage provided to the converter is converted to a power signal, which is used to generate a bias current that is fed to the integration capacitor 66, creating an output voltage 65 that is proportional to energy. A quadrant slope adjuster ("QSA") circuit 68 has an output 69 connected to the converter circuit 60 to adjust its rate of output voltage 65 increase, or output slope, stored in the QSA register. This data stored in the QSA register having been loaded from the printer controller 14 which obtained this data from the memory chip 31 via memory reader 19. Each quadrant has its own QSA, so that each may be adjusted slightly. In the embodiment described here, each QSA provides a +/−5% adjustment in the slope, so that small variations in performance and energy requirements among the quadrants may be compensated for and controlled. It will be appreciated any other adjustment ranges may be implemented when desired.

A pulse width control block 70 includes logic for pulse width truncation and a continuous-time voltage comparator and has a first input connected to the output 65 of the converter circuit 60 (which transmits the energy signal), a second input connected to the output 86 of a digital-to-analog-converter ("DAC") 80, which is in turn controlled by a setpoint voltage reference device 72, and a control line 58 connected to the firing line 56. The comparator of control block 70 has an output line 74 that transmits a voltage pulse which is initiated upon triggering by a pulse on the firing line and terminates when whichever of the following occurs first (1) the output of the converter circuit 60 equals the output of the DAC 80, or (2) when the firing pulse terminates,. A truncation detect signal on a second comparator output line 75 provides status information to control logic circuitry indicating that the circuit has truncated the firing pulse. This truncation detect signal is used for the calibration purposes discussed below.

The setpoint reference voltage device 72 includes a 7-line input bus 76 connected to an internal register in device 72 which is loaded by the printer 10 and to the 7-bit DAC 80. DAC 80 converts a digitally encoded voltage value received from the printer to a reference voltage output 86. The DAC 80 has an output voltage 86 that allows a delivered energy range of 1 $\mu$J to 7 $\mu$J. In a preferred embodiment, the DAC 80 is a precision poly resistor string combined with an analog switch matrix.

Each firing resistor 44 is connected to a corresponding firing switch 82 connected to a ground line 83 and having a control input connected to the output 85 of a firing pulse modulator 84. The firing pulse modulator receives print data on a 9 bit bus and outputs a firing signal on output line 85 to each selected firing switch 82.

To fire a selected group of the resistor set 42, the printer sends an input voltage $V_{pp}$ on line 40, and transmits a full-duration firing pulse on line 56. In response to the firing pulse, the comparator transmits the firing pulse to the resistor firing switches 82, causing the selected switches to close, connecting the resistors to ground for current flow to generate firing energy. Also in response to initiation of the firing pulse on line 56, the switch 52 closes, allowing a small current to flow through resistors 50 and 54, with the voltage between the resistors on line 62 being proportional to the input voltage $V_{pp}$ on line 40 as affected by the current drawn by the activated resistors.

The firing pulse also triggers the converter circuit 60 to reset the capacitor to zero, zeroing the output voltage. The input voltage is converted to a power signal by conventional analog circuitry. The power signal is then used to generate a bias current that is fed into the integration capacitor 66, creating an output voltage ramp with a slope proportional to the power dissipated during the pulse. The rate of voltage rise is further modified based on the stored data in the QSA circuit 68, which is based on initial calibration of the print cartridge on the manufacturing line discussed below.

Figure 3:
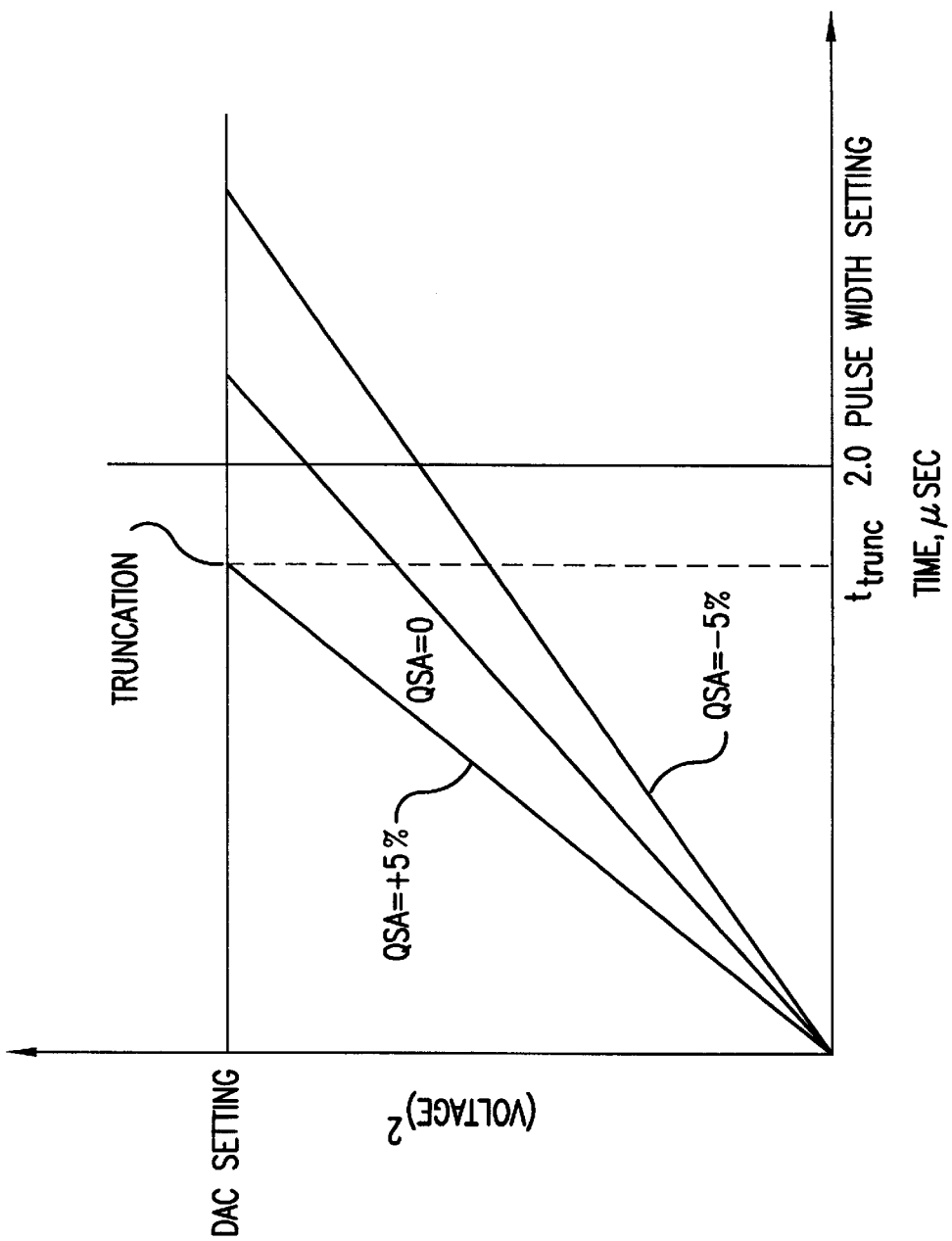
FIG. 3 is a graph showing the voltage squared for three quadrant slope adjustments versus time, or pulse width, and showing when truncation occurs.

FIG. 3 is a graph showing the voltage squared, for three different quadrant slope adjustments (+5%, 0, −5%), versus time, or pulse width, and showing when truncation occurs at when the voltage of the DAC setting is reached. For the +5% quadrant slope adjustment, pulse truncation occurs at $t_{trunc}$ when the voltage squared equals the DAC setting. For the 0 and −5% quadrant slope adjustments. truncation does not occur and the pulse is terminated by the predetermined pulse width of 2 microseconds.

Figure 4A:
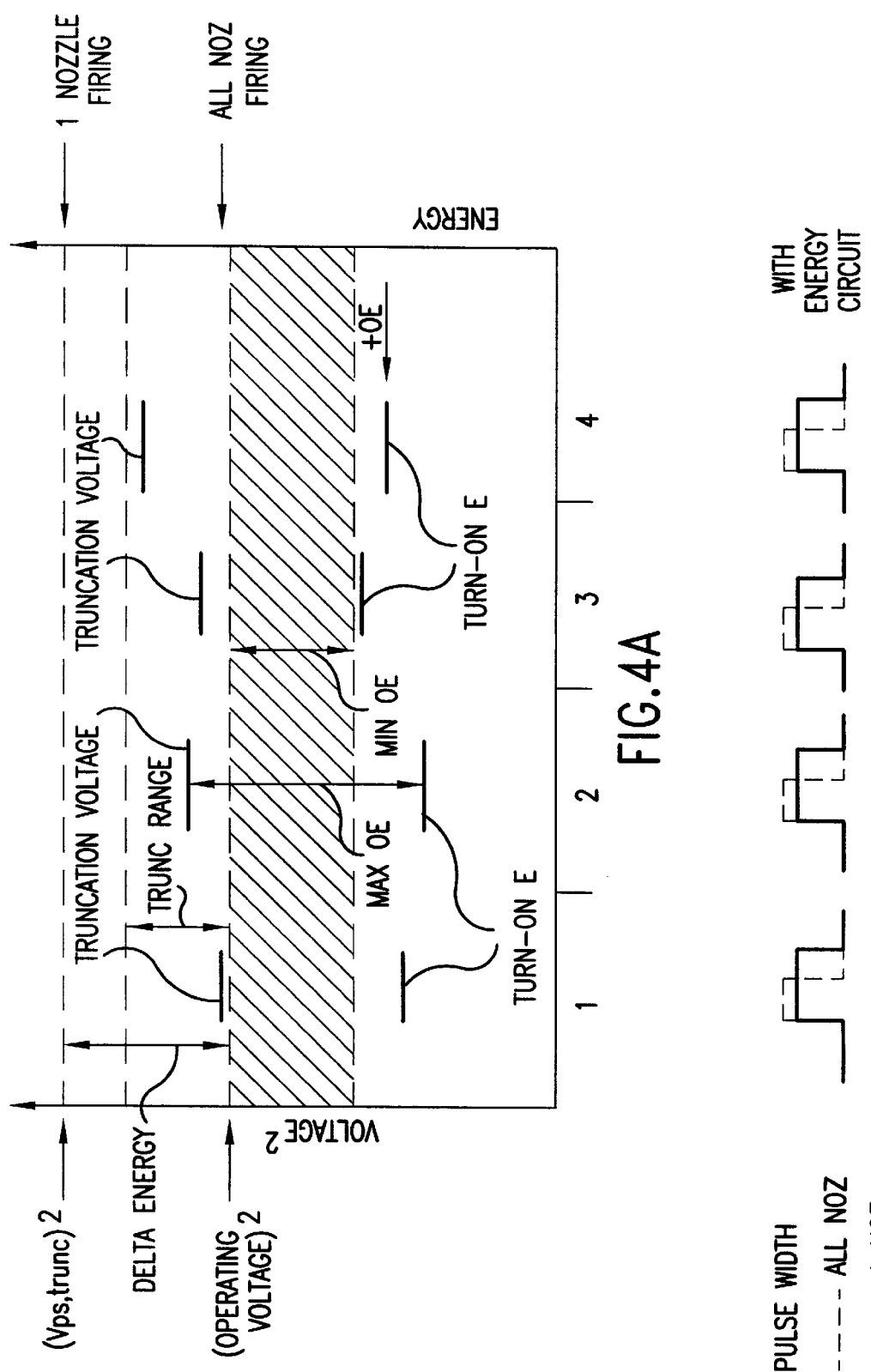
FIGS. 4A and 4B are graphs showing the relationship between the operating voltage, truncation voltage, minimum over energy, maximum over energy, turn-on energy, and pulse width truncation.
Figure 4B:
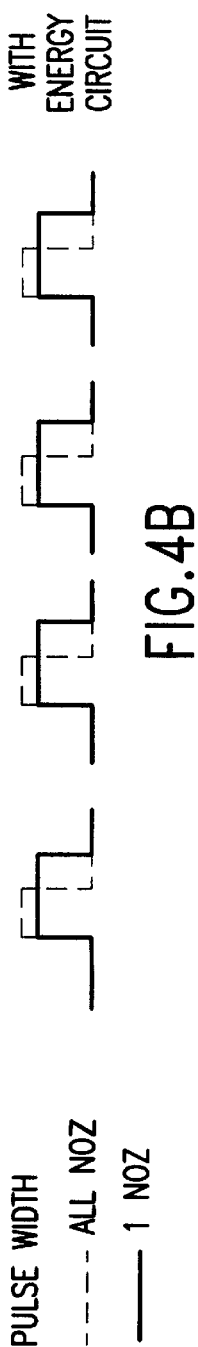

FIGS. 4A and 4B show the relationship between the operating voltage, trucation voltage, minimum over energy, maximum over energy, turn-on energy, and pulse width truncation.

Prior to delivery and use, the print cartridge undergoes a one-time factory calibration process to compensate for quadrant-to quadrant variations within the print cartridge, such as in print cartridge resistors and internal trace resistances. Although the resistances in the printer, and in the power connections between the printer carriage and the print cartridge tend to differ from printer to printer, and with different installations of the same print cartridge in the same printer, the variations internal to a given print cartridge are best identified and compensated for as a manufacturing process. Internal print cartridge variables include print cartridge flex circuit power and ground line resistance, flex circuit-to-die tab bond resistance, die traces connecting each quadrant to power and to ground, and semiconductor process and resistor variations. Compensating for these variables at manufacturing minimizes the diagnostic circuitry requirements of the printer, and limits calibration delays upon print cartridge installation by the user.

Manufacturing calibration serves to identify the operational differences between the four functional quadrants of the printhead die, in particular the different resistances in the traces and connections for each different quadrant. Also, the resistor dimensions may vary within tolerances, and these variations may tend to be consistent within each quadrant, and different between quadrants. In addition, the semiconductor manufacturing process may generate variations that are minimal within each quadrant, but which create variations within each die, from quadrant to quadrant.

Figure 5A:
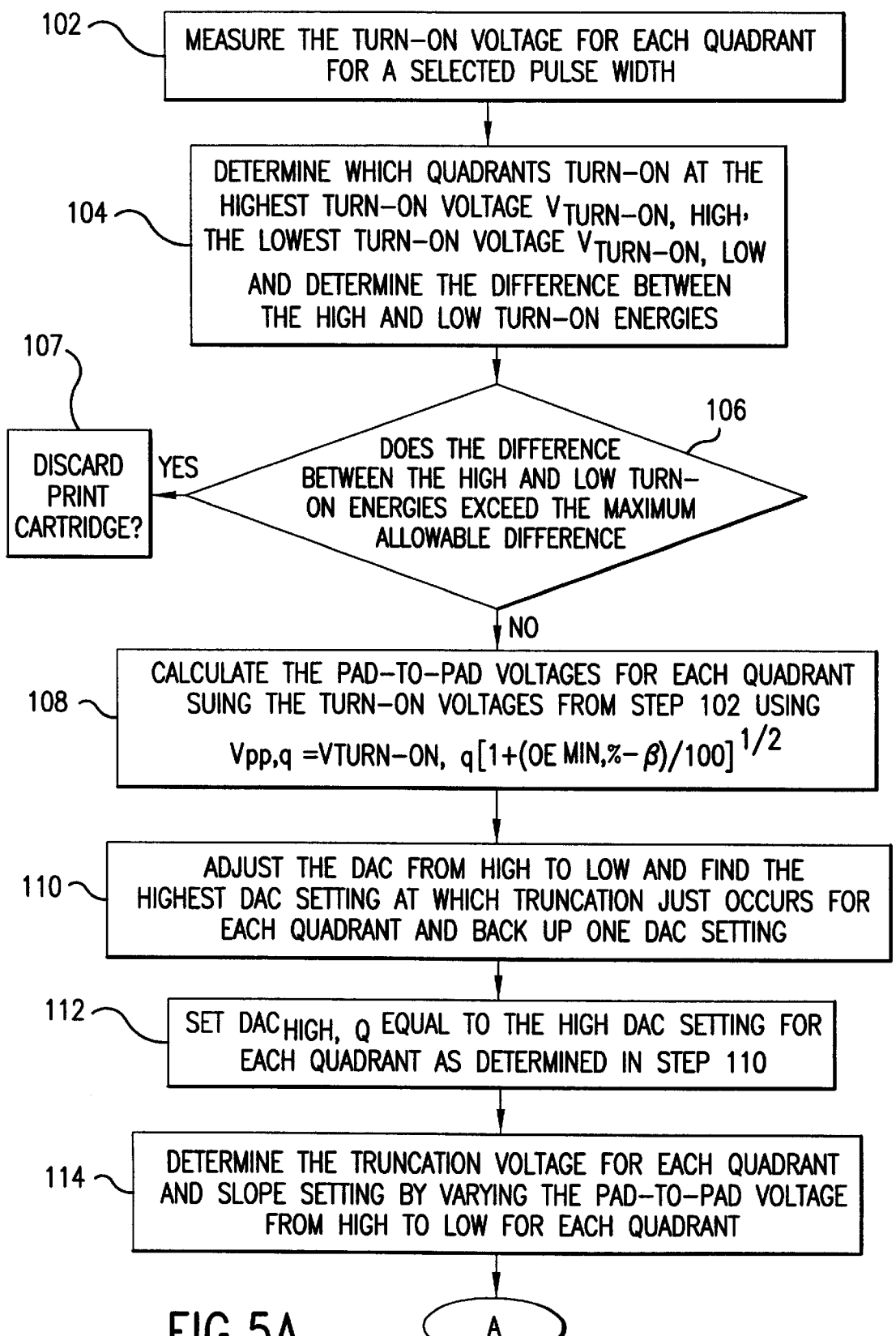
FIGS. 5A, 5B and 5C are schematic flowchart showing a calibration procedure for a print cartridge during manufacture.
Figure 5B:
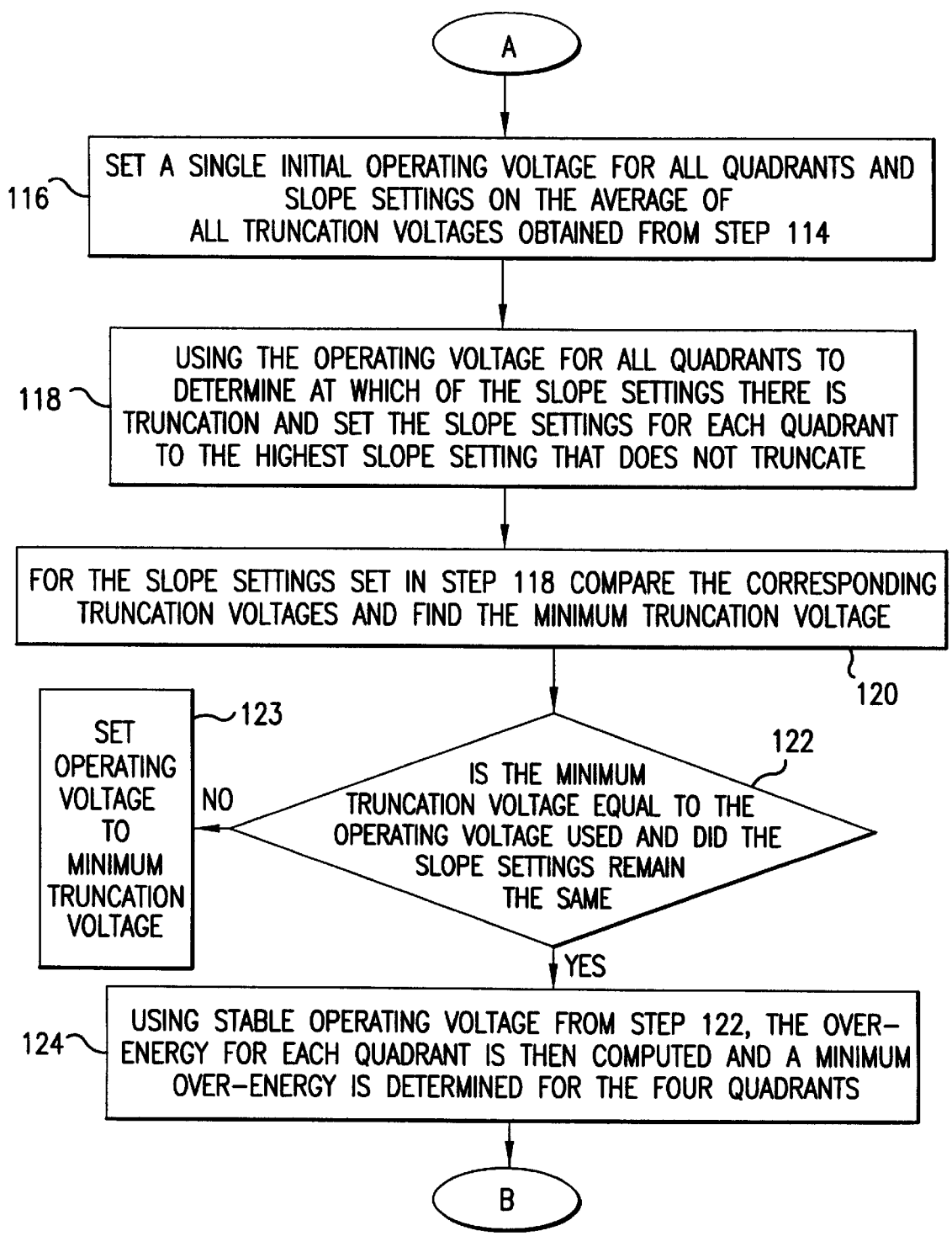
Figure 5C:
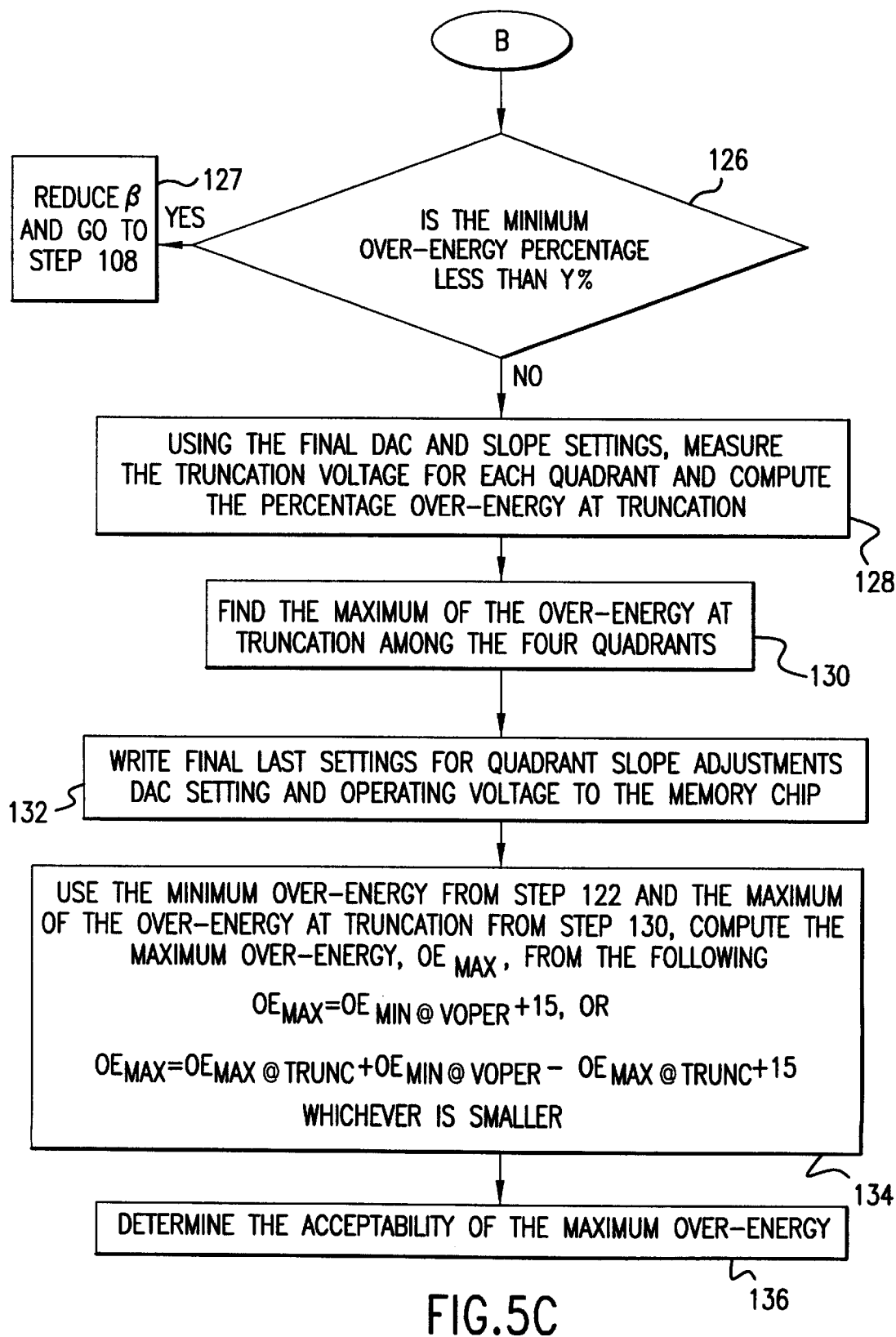

As the printer must have adequately fast throughput and carriage scan speed, the cartridge is calibrated with a firing pulse width somewhat less than the actual maximum pulse width desired The time between firing pulses is equal to [scan speed (inches/sec)/dots per inch]+margin. FIG. 5 is a schematic flowchart showing a calibration procedure for an print cartridge during manufacture. In step 102 with the energy compensation circuit turned off (so that truncation does not occur) and with the pulse width set to a predetermined nominal maximum pulse width which is less than the actual maximum pulse width, e.g., 2.0 usec, the turn-on voltage, $V_{turn-on,\ q}$, is measured one quadrant at a time. In step 104, determine which quadrant turns on at the highest turn-on voltage $V_{turn-on,\ high}$, and which quadrant turns on at the lowest turn-on voltage $V_{turn-on,\ low}$. In step 106, the difference between the highest turn-on voltage and the lowest turn-on voltage is determined. If the this difference exceeds a specified maximum value, the print cartridge may be rejected (step 107); otherwise proceed to step 108.

In step 108, the energy circuit is activated and for each quadrant, q, the quadrant slope adjustment is set to −5% and $V_{pp,\ q}$ is calculated as follows $$V_{pp,\ q} = V_{turn-on,\ q}\ [1+(OE_{min,\ \%}-\beta)/100]^{1/2}$$

where $V_{pp}$ is the voltage across the pads for the quadrant, $V_{turn-on,\ q}$ is the turn-on voltage found in step 102, $OE_{min,\ \%}$ is the desired minimum percent over-energy and β is a constant which is less than the desired minimum percent over-energy and defines the starting point for the iteration procedure described below. In step 110, for each quadrant, find the highest DAC setting, $DAC_{high,\ q}$, at which each quadrant truncates by adjusting the DAC setting from high to low until the pulse width for each quadrant just truncates.

In step 112 determine the quadrant slope adjustments, by setting the DAC to the highest setting, $DAC_{high,\ q}$, found in step 110. In step 114 vary the pad-to-pad voltage, $V_{pp,\ q}$, from high to low for each quadrant at each of its three slope settings (−5%, 0, +5%) to find the truncation voltage $V_{trunc,\ q}$ in each quadrant for each of the slope settings.

In step 116, set the initial operating voltage, $V_{oper,\ initial}$, for all quadrants equal to the average of all of the voltages $V_{trunc,\ q}$ found in step 114. In step 118, use the $V_{oper}$ calculated in step 114 or from step 123 for all quadrants and determine for each quadrant at which of the slope settings there is no truncation. Set the slope setting to the highest slope setting, (+=highest, −=lowest), that does not truncate for each quadrant.

In step 120, for the slope settings set in step 118 compare the corresponding truncation voltages and find the minimum truncation voltage. In step 122, this minimum truncation voltage from step 120 is compared with the current operating voltage. If the minimum truncation voltage is approximately equal to current operating voltage and the slope settings have not changed, go to step 124, if they have changed go to step 123 and set the operating voltage equal to the minimum truncation voltage. Using this as the new operating voltage, steps 118 through 122 are repeated until the operating voltage $V_{oper}$ and the slope adjustment values do not change from the previous iteration.

In step 124 using the stable operating voltage $V_{oper}$ found in steps 116 and 118, the over-energy for each quadrant $OE_{@Voper,\ q}$ is then computed. The minimum over-energy, $OE_{@Voper,\ min}$, is then determined for the four quadrants. In step 126, compare this minimum over-energy from step 124 with the minimum over-energy $OE_{min}$ initially selected. If it is less than $OE_{min}$, reduce β and repeat steps 108 through 126 using an incrementally smaller β. This number should continue to be changed by 0.2 on each successive iteration until the minimum over-energy target is met. In step 128, for the final DAC and slope settings and the corresponding truncation voltage for each quadrant, compute the percent over-energy at truncation. In step 130, the maximum value of the over-energy $OE_{max@trunc}$ is determined from the $OE_{@trunc,\ q}$ among the four quadrants. In step 132, write the last settings of the quadrant slope adjustments, DAC setting, and operating voltage to the memory chip 31.

In step 134, use the final value for over-energies, $OE_{min@Voper}$ from step 122 and $OE_{max@trunc}$ from step 130, compute the maximum over-energy, $OE_{max}$, as follows:

$$OE_{max} = OE_{min@Voper} + OE_{min},\ \text{or}$$

$$OE_{max} = [OE_{max@trunc} + OE_{min@voper} - OE_{max@trunc} + OE_{min}]/4$$

whichever is smaller.

The maximum value for $OE_{max}$ is 30% for magenta and 35% for black, cyan and yellow. The acceptability of the maximum over-energy is then determined in step 136. If a print cartridge exceeds these values, it should be rejected.

Figure 6A:
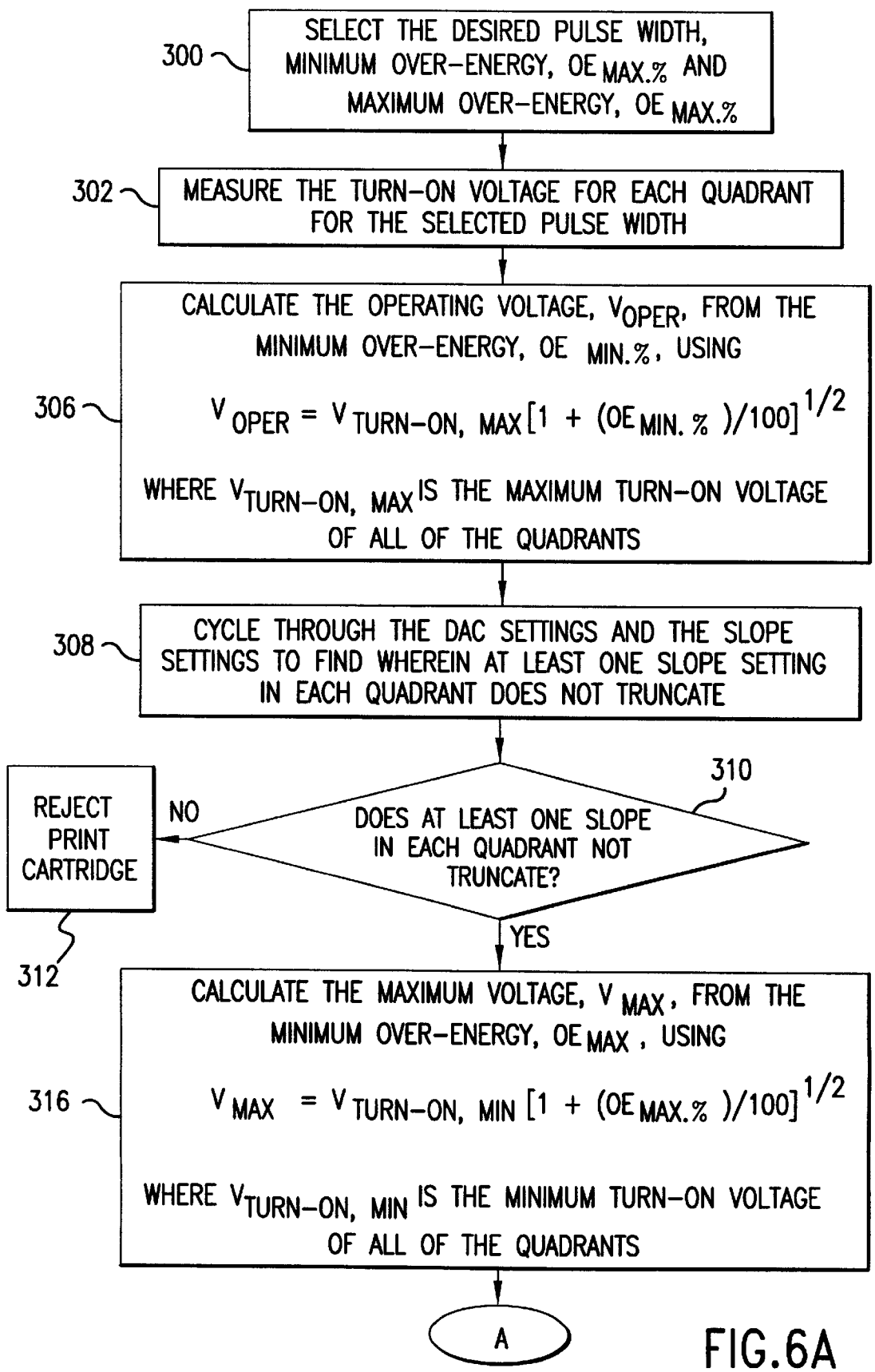
FIGS. 6A and 6B are schematic flowcharts showing a simplified calibration procedure for a print cartridge during manufacture.
Figure 6B:
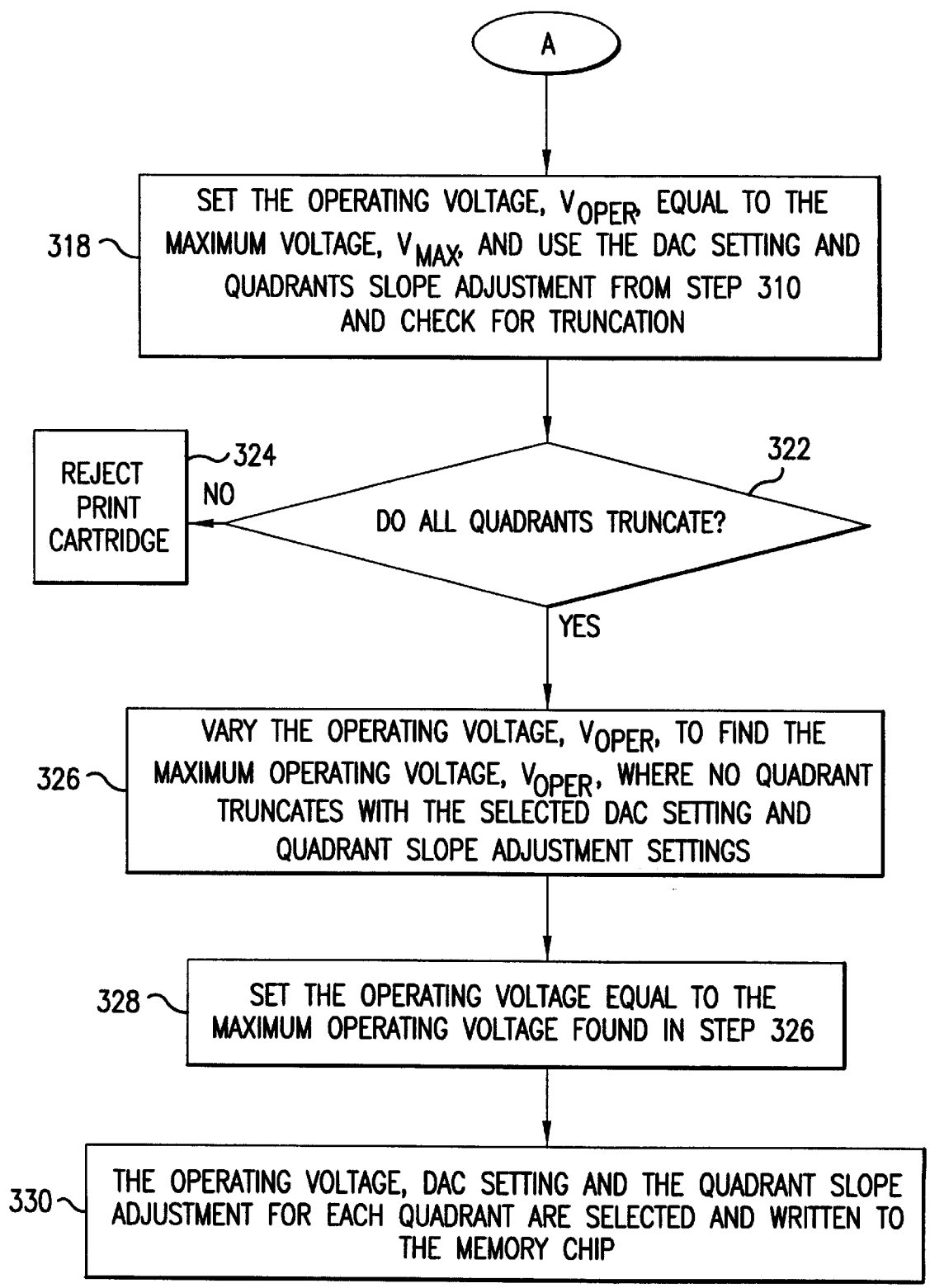

FIG. 6 is a simplified alternative schematic flowchart showing a calibration procedure for an print cartridge during manufacture. In step 300, select the desired pulse width, minimum over-energy, $OE_{min,\%}$ and maximum over-energy, $OE_{max,\%}$. In step 302, measure the turn-on voltage for each quadrant for the selected pulse width.

In step 306 calculate the operating voltage, $V_{oper}$, from the minimum over-energy, $OE_{min,\%}$, using $$V_{oper} = V_{turn-on,\ max}[1+(OE_{min,\ \%})/100]^{1/2}$$

where $V_{turn-on,\ max}$ is the maximum turn-on voltage of all of the quadrants.

In step 308, the DAC and the slope settings are cycled through to find wherein at least one slope setting in each quadrant does not truncate. In step 310, determine whether at least one slope in each quadrant does not truncate? If no, reject the print cartridge. If yes, proceed to step 316.

In step 316, calculate the maximum voltage, $V_{max}$, from the maximum over-energy, $OE_{max}$, using $$V_{max} = V_{turn-on,\ min}[1+(OE_{max,\ \%})/100]^{1/2}$$

where $V_{turn-on,\ min}$ is the minimum turn-on voltage of all of the quadrants.

In step 318, set the operating voltage, $V_{oper}$, equal to the maximum voltage, $V_{max}$, and use the DAC setting and quadrant slope adjustment settings from step 310, and check for truncation. In step 322, determine whether all quadrants truncate? If yes go to step 324, if no reject the print cartridge. In step 326 vary the operating voltage, $V_{oper}$, to find the maximum operating voltage where no quadrant truncates with the selected DAC settings and quadrant slope adjustment settings. In step 328, set the operating voltage equal to the maximum operating voltage found in step 326. In step 330 the operating voltage, DAC setting and the quadrant slope adjustment for each quadrant are selected and written to the memory chip.

With the final settings for quadrant slope adjustments, DAC setting and operating voltage written to the memory chip during manufacturing, the cartridge may be delivered to a user, either in conjunction with a printer, or as a replacement cartridge, this enables the printer in which the print cartridge is eventually installed to determine whether there are intolerably high parasitic resistances that were not detectable in the print cartridge alone during manufacturing calibration. Such resistances might occur with a printer wiring fault, or poor conduction at the print cartridge-printer contacts. If a high resistance were encountered, the system circuitry would compensate with a higher input voltage $V_{pp}$. This is acceptable up to a point, but a too high a voltage needed to overcome resistance when all resistors are firing, will lead to a much higher voltage at a single firing resistor. Of course, this can be compensated for by substantial pulse width truncation to achieve controlled energy, but beyond a certain point, the resistor is unable to reliably withstand the power transmitted, as discussed above.

In operation, $V_{ps}$ is set to a level adequate to ensure adequate firing energy levels for full drop volume firing in "blackout conditions," i.e., when all resistors are fired simultaneously. Because firing energy is proportional to the product of the square of the voltage and the time duration, $V_{ps}$ must be high enough to provide adequate energy within the limited time afforded for printing each dot, before the next dot is to be printed at the desired printer scan rate. Part of the calibration process includes establishing a voltage to provide a limited firing energy threshold for all firing conditions, regardless of the number of resistors being fired simultaneously.

Figure 7:
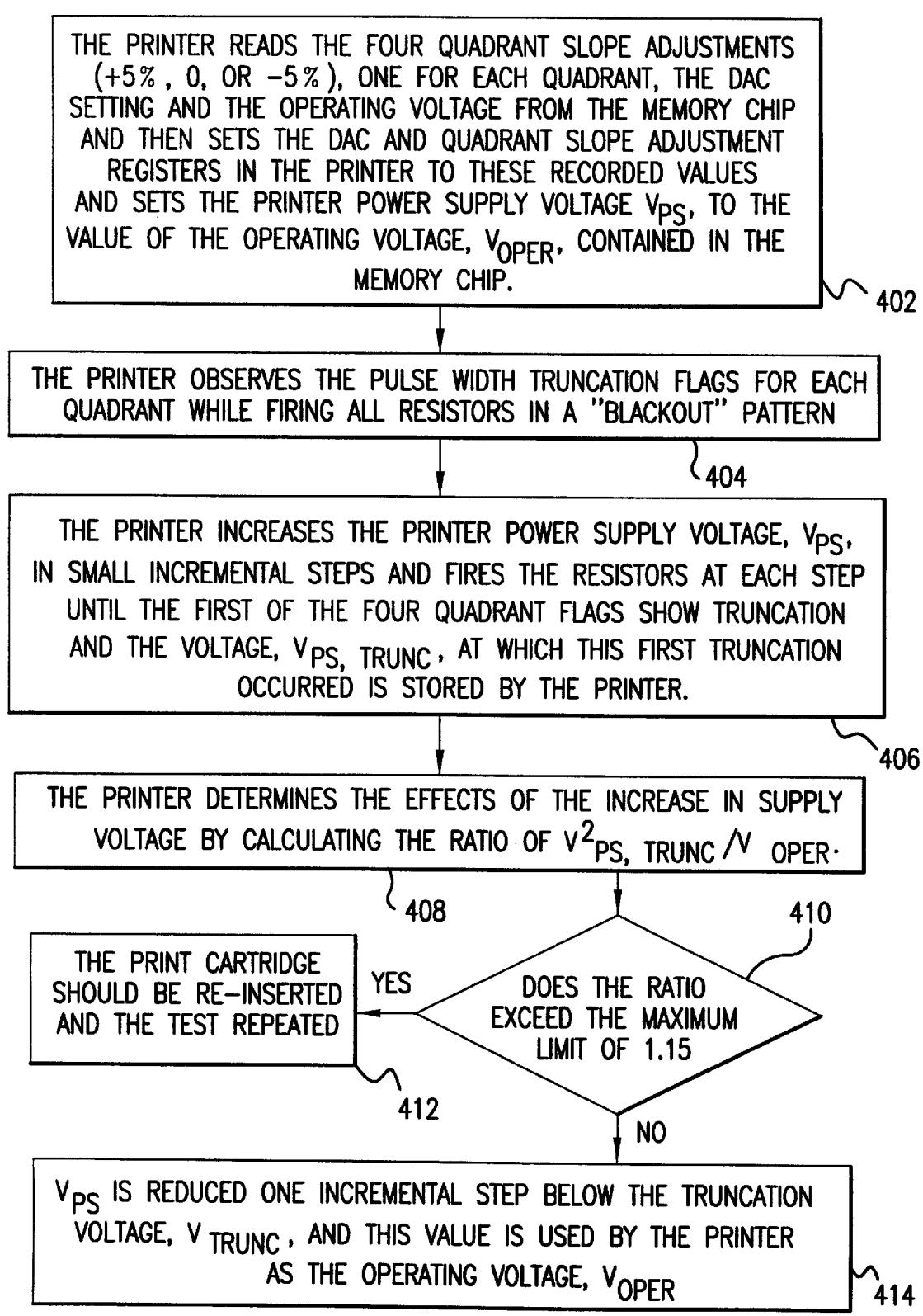
FIG. 7 is a schematic flowchart showing a calibration procedure for a printer upon installation of the print cartridge in the printer

When the print cartridge is installed in the printer, the printer will do a test on the installed print cartridge to determine the correct power supply voltage, $V_{ps}$ to apply to the print cartridge. Referring to FIG. 7, the printer in step 402 reads the four quadrant slope adjustments (+5%, 0, or −5%), one for each quadrant, the DAC setting and the operating voltage from the memory chip and then sets the DAC and quadrant slope adjustment registers in the printer to these recorded values and sets the printer power supply voltage $V_{ps}$, to the value of the operating voltage, $V_{oper}$, contained in the memory chip.

In step 404, the printer observes the pulse width truncation flags, which are set when truncation occurs, for each quadrant while firing all resistors in a "blackout" pattern. In step 406, the printer increases the printer power supply voltage $V_{ps}$ in small incremental steps and fires the resistors at each step until the first of the four quadrant truncation flags show truncation and the voltage, $V_{ps,\ trunc}$, at which this first truncation occurred is stored by the printer.

In step 408, the printer determines the effects of the increase in supply voltage by calculating the ratio of $V^2_{ps,\ trunc}/V^2_{oper}$. In step 410, if this ratio is greater than or equal to a maximum limit, the print cartridge should be re-inserted and the test repeated (step 412). If the ratio does not exceed the maximum limit, then in step 414 $V_{ps}$ is reduced one incremental step below the truncation voltage, $V_{ps,\ trunc}$, and this value should be used by the printer as the operating voltage, $V_{oper}$. If the ratio remains greater than or equal to the maximum limit, the printer should be serviced.

The maximum limit is necessary because when excessive parasitic resistance is present, there is too large a difference in the amount of voltage applied to the print cartridge when all nozzles are firing and when only one nozzle is firing. The ratio, is indicative of added parasitic resistances which, when the resistors are fired individually, can cause a power increase in the heater resistors and also an energy increase in the resistors if the energy compensation circuit did not compensate from an energy standpoint by truncating the pulse width. The increased power in the resistors, along with energy, is a resistor life consideration. It is therefore necessary to limit the power increase by limiting the added parasitic resistance as is done in the above procedure.

While the above is discussed in terms of specific and alternative embodiments, the invention is not intended to be so limited.

What is claimed is:

1. A method of calibrating an inkjet print cartridge having a plurality of ink firing resistor groupings each containing at least one resistor and a memory device, the method comprising the steps:

selecting the desired pulse width, minimum over-energy and maximum over-energy;

measuring a turn-on voltage for each of the plurality of ink firing resistor groupings for the selected pulse width by applying the selected pulse width to each of the plurality of ink firing resistor groupings;

calculating an operating voltage for at least one of the plurality of ink firing resistor groupings from the minimum over-energy;

calculating a maximum voltage for at least one of the plurality of ink firing resistor groupings from the maximum over-energy;

setting the operating voltage equal to the maximum voltage;

varying the operating voltage to find a maximum operating voltage;

setting the operating voltage equal to the maximum operating voltage found; and writing the operating voltage to the memory device.

2. The method as set forth in claim 1, wherein the operating voltage is calculated using a maximum turn-on voltage computed from the measured turn-on voltage at each of the plurality of ink firing resistor groupings.

3. The method as set forth in claim 2, wherein each of the resistor groupings has a digital-to-analog converter setting and a group slope adjustment setting.

4. The method as set forth in claim 3, further comprising cycling through the digital-to-analog converter setting and the group slope adjustment setting until at least one group slope adjustment setting in each of the resistor groupings does not truncate.

5. The method as set forth in claim 4, further comprising finding the maximum operating voltage where none of the resistor groupings truncates with the selected digital-to-analog setting and group slope adjustment settings.

6. The method as set forth in claim 1, wherein calculating the maximum voltage further comprises using a minimum turn-on energy computed from the measured turn-on voltage at each of the resistor groupings.

7. A method of operating an inkjet printer in order to determine operating settings to apply to a print cartridge installed in the printer, comprising the steps:

measuring a turn-on voltage for each of a plurality of ink firing resistor groupings for a selected pulse width by applying the selected pulse width to each of said plurality of ink firing resistor groupings;

reading calibration information from a memory chip on the print cartridge;

setting the printer to use the calibration information;

performing tests using the calibration information to determine operating conditions for the printer;

adjusting the operating conditions for the printer using the calibration information and one of the measured turn-on voltages; and storing the operating conditions in the printer.

8. The method as set forth in claim 2, wherein the print cartridge has a plurality of ink firing resistor groupings having at least two sections and the calibration information comprises at least one of: (a) a section slope adjustment setting for each section; (b) a digital-to-analog setting; (c) an operating voltage.

9. The method as set forth in claim 8, wherein the calibration information includes a section slope adjustment setting and a digital-to-analog setting and further comprising setting a current digital-to-analog converter to the digital-to-analog setting and a current section slope adjustment setting to the section slope adjustment setting.

10. The method as set forth in claim 9, wherein the calibration information further includes an operating voltage and further comprising setting a printer power supply voltage to the operating voltage.

11. The method as set forth in claim 8, wherein performing tests further comprises observing a pulse width truncation flag for each of the resistor groupings.

12. The method as set forth in claim 11, wherein each of the resistor groupings contains at least one resistor and further comprising observing a pulse width truncation flag while firing all resistors in each of the resistor groupings in a blackout pattern.

13. The method as set forth in claim 2, wherein adjusting the operating conditions further comprises increasing a printer power supply voltage in small incremental steps and firing the resistors at each step until a group flag shows truncation.

14. The method as set forth in claim 13, further comprising setting a truncation power supply voltage equal to a value of the printer power supply voltage at which the group flag shows truncation.

15. The method as set forth in claim 14, further comprising forming a ratio of the truncation power supply voltage to the operating voltage.

16. The method as set forth in claim 15, further comprising determining whether the ratio exceeds a maximum limit.

17. The method as set forth in claim 16, further comprising reducing the printer power supply voltage to a value one incremental step below the truncation power supply voltage and setting the operating voltage to this value.

18. A method of calibrating an inkjet print cartridge having a printhead die defined by resistor groupings having at least one resistor, each resistor grouping having electrical components with associated electrical characteristics, the method comprising:

providing a firing and energy control circuit on the inkjet print cartridge for sending a firing pulse to the electrical components, the firing pulse having an associated pulse width, minimum over-energy and maximum over-energy selecting a testing range for the inkjet print cartridge by selecting the associated pulse width, minimum over-energy and maximum over-energy;

measuring a turn-on voltage of each resistor grouping for the selected pulse width by applying the selected pulse width to the electrical components in each resistor grouping;

calculating an optimal calibration value for the measured turn-on voltage of each resistor grouping; and storing the optimal calibration values.

19. The method as set forth in claim 18 wherein calculating an optimal calibration value further comprises calculating an operating voltage from the selected minimum over-energy.

20. The method as set forth in claim 19 further comprising calculating a maximum voltage from the maximum over-energy.

21. The method as set forth in claim 20, further comprising:

determining a maximum operating voltage by varying the operating voltage such that none of the resistor groupings truncate; and setting the operating voltage equal to the maximum voltage.

22. The method as set forth in claim 21, further comprising determining whether all of the resistor groupings truncate.

23. The method as set forth in claim 18 further comprising determining a maximum turn-on voltage from the turn-on voltage of each of the resistor groupings.

24. The method as set forth in claim 23 further comprising using the maximum turn-on voltage in calculating the operating voltage.

25. A printing apparatus comprising:

an inkjet printhead having an integrated memory device with calibration information stored therein;

a plurality of ink firing resistor groupings;

a firing and energy control circuit that applies a selected pulse width to each grouping for measuring a turn-on voltage for each of the plurality of ink firing resistor groupings for the selected pulse width; and a controller for accessing the memory device and using at least one of the turn-on voltage and the calibration information for performing tests to determine optimal operating conditions for the printing apparatus.

26. The printing apparatus as set forth in claim 25, further comprising storing and using the optimal operating conditions.

27. The printing apparatus as set forth in claim 26, wherein the inkjet printhead includes a resistor groupings having at least one resistor and wherein using the operating conditions comprises increasing a printer power supply voltage in small incremental steps and firing the at least one resistor at each step until a flag corresponding to at least one of the resistor groupings shows truncation.

28. The printing apparatus as set forth in claim 25, further comprising an ink supply for supplying ink to the inkjet printhead and a carriage supporting the printhead over a print media.

29. The printing apparatus as set forth in claim 28, further comprising a substrate having a front surface and an opposing back surface and ink ejection elements being formed on the front surface.

30. The printing apparatus as set forth in claim 25, wherein the inkjet printhead includes resistor groupings having at least one resistor and wherein performing tests further comprises observing a pulse width truncation flag for each of the resistor groupings.

* * * * *